United States Patent
Lennard et al.

(10) Patent No.: US 6,543,673 B2
(45) Date of Patent: Apr. 8, 2003

(54) DISSOLVING SHUNT CONNECTION SYSTEM FOR ESD SENSITIVE COMPONENTS

(75) Inventors: Michael Henry Lennard, Lyons, CO (US); William Leon Rugg, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/892,303

(22) Filed: Jun. 26, 2001

(65) Prior Publication Data

US 2002/0053590 A1 May 9, 2002

Related U.S. Application Data

(60) Provisional application No. 60/246,170, filed on Nov. 6, 2000.

(51) Int. Cl.[7] .................. B23K 31/02; B23K 31/00; G11B 5/48
(52) U.S. Cl. .................. 228/179.1; 228/175; 228/176; 228/177; 228/178; 360/240; 360/245.9; 361/8; 361/55
(58) Field of Search ............ 228/179.1, 180.1, 228/180.21, 180.22, 173.1, 102, 103, 175–178, 189; 29/603.01–603.04; 360/103–106, 97.02, 245.9, 128, 240; 219/243; 361/8, 55

(56) References Cited

U.S. PATENT DOCUMENTS

| | | | | |
|---|---|---|---|---|
| 4,699,212 A | * | 10/1987 | Andersson et al. | 16/2.1 |
| 4,733,325 A | * | 3/1988 | Loesch | 361/19 |
| 5,465,186 A | * | 11/1995 | Bajorek et al. | 360/323 |
| 5,699,212 A | * | 12/1997 | Erpelding et al. | 360/245.8 |
| 5,812,357 A | * | 9/1998 | Johansen et al. | 361/212 |
| 5,963,415 A | * | 10/1999 | Johansen | 361/212 |
| 6,034,851 A | * | 3/2000 | Zarouri et al. | 360/128 |
| 6,054,330 A | | 4/2000 | Phipps et al. | 438/3 |
| 6,075,676 A | | 6/2000 | Hiraoka et al. | 360/104 |
| 6,119,923 A | * | 9/2000 | Vinciarelli et al. | 228/179.1 |
| 6,146,813 A | * | 11/2000 | Girard et al. | 430/319 |
| 6,147,326 A | * | 11/2000 | Backlund | 219/243 |
| 6,351,352 B1 | * | 2/2002 | Khan et al. | 360/264.2 |

* cited by examiner

Primary Examiner—Tom Dunn
Assistant Examiner—L. Edmondson
(74) Attorney, Agent, or Firm—Merchant & Gould P.C.

(57) ABSTRACT

A method and system are disclosed for protecting an electrical component from electrostatic discharge prior to its electrical connection to an additional component. Specifically, a flex on suspension circuit of a disc drive that is electrically connected to the read/write head is disclosed as having exposed leads for connection to a printed circuit cable assembly. The exposed leads are shunted with a solder conductor such as solder tape after testing of the circuit and head to prevent electrostatic build-up across the read and write elements. The flex on suspension circuit is then electrically connected to the printed circuit assembly cable by reflowing the solder conductor to bond the exposed leads of the flex on suspension circuit to the electrical contacts of the printed circuit assembly cable and also to remove the electrical short established between the exposed leads by the solder conductor.

25 Claims, 3 Drawing Sheets

DISSOLVING SHUNT CONNECTION SYSTEM FOR ESD SENSITIVE COMPONENTS

RELATED APPLICATIONS

This application claims priority of U.S. provisional application Ser. No. 60/246,170 filed Nov. 6, 2000.

FIELD OF THE INVENTION

This application relates generally to preventing electrostatic discharge in sensitive electrical components and more particularly to a shunt connection system for protecting sensitive components during manufacturing procedures.

BACKGROUND OF THE INVENTION

Electrostatic discharge (ESD) during manufacturing of many electrical components often causes component failure. Electrostatic potential may build through handling of the component during various manufacturing and testing procedures. The electrostatic potential around the component may reach several thousands of volts, and the component is typically designed for a much smaller voltage drop. The discharge current through the component from the electrostatic potential renders it unusable.

For example, in disc drives an ESD sensitive magnetoresistive read/inductive write head is used to read data from, and write data to, a magnetic disc. The read/write head is mounted to a movable arm that transports the head to the appropriate location over the disc. The read/write head passes electrical signals through a flexible circuit positioned on the movable arm and connected to a printed circuit board. The flexible circuit has one portion that is attached to the suspension on the arm and electrically connected to the read/write head. This flex on suspension (FOS) portion is also electrically connected to a printed circuit cable assembly (PCCA) that is electrically connected to the printed circuit board. The PCCA permits the arm to move relative to the preamplifier printed circuit board while maintaining electrical continuity.

The FOS coupled to the read/write head must be tested for proper operation before a head gimbal assembly and/or head stack assembly including the FOS and read/write head is fully installed in the disc drive. The manufacturing process requires shunting the leads of the FOS from the read/write head together to prevent electrostatic build-up prior to testing, then removing the shunt so that the FOS and read/write head can be tested. After testing, the leads must be reshunted to reestablish ESD protection. The conventional reshunting process involves manually soldering the leads together where the first shunt was removed. After reshunting occurs, the FOS is then connected to the PCCA by manually removing the shunted portion and soldering the FOS contacts to the PCCA contacts. However, manually removing the shunted portion of the FOS often results in ESD through the read/write head rendering it unusable.

Accordingly there is a need for a system for protecting sensitive components from ESD during the manufacturing and testing processes.

SUMMARY OF THE INVENTION

Against this backdrop the present invention has been developed. Embodiments of the present invention provide ESD protection during the manufacturing process by shunting the electrical leads and then utilizing the material used for shunting to establish an electrical bond to an additional electrical component.

The present invention may be viewed as a method for protecting an electrical component from electrostatic discharge prior to being electrically connected to an additional component. The method involves shunting one or more conductive leads extending from the electrical component to a second conductive lead extending from the electrical component with one or more solder conductors. The method further involves contacting the one or more conductive leads, the second conductive lead, and the one or more solder conductors to electrical contacts of the additional component. The method additionally involves heating the one or more solder conductors until the one or more solder conductors electrically bond the one or more conductive leads and the second conductive lead to the electrical contacts of the additional component and until the one or more solder conductors no longer shunt the one or more conductive leads to the second conductive lead.

The present invention may also be viewed as a system for preventing electrostatic discharge through an electrical component prior to electrically connecting the electrical component to an additional component. The system includes a solder conductor shunting one or more conductive leads extending from the electrical component to a second conductive lead extending from the electrical component. The system also includes electrical contacts on the additional component contacting the one or more conductive leads, the second conductive lead, and the one or more solder conductors. The system additionally includes heat applied to the one or more solder conductors until the one or more solder conductors electrically bond the one or more conductive leads and the second conductive lead to the electrical contacts of the additional component and until the one or more solder conductors no longer shunt the one or more conductive leads to the second conductive lead.

These and various other features as well as advantages which characterize the present invention will be apparent from a reading of the following detailed description and a review of the associated drawings.

DETAILED DESCRIPTION

Figure 1:
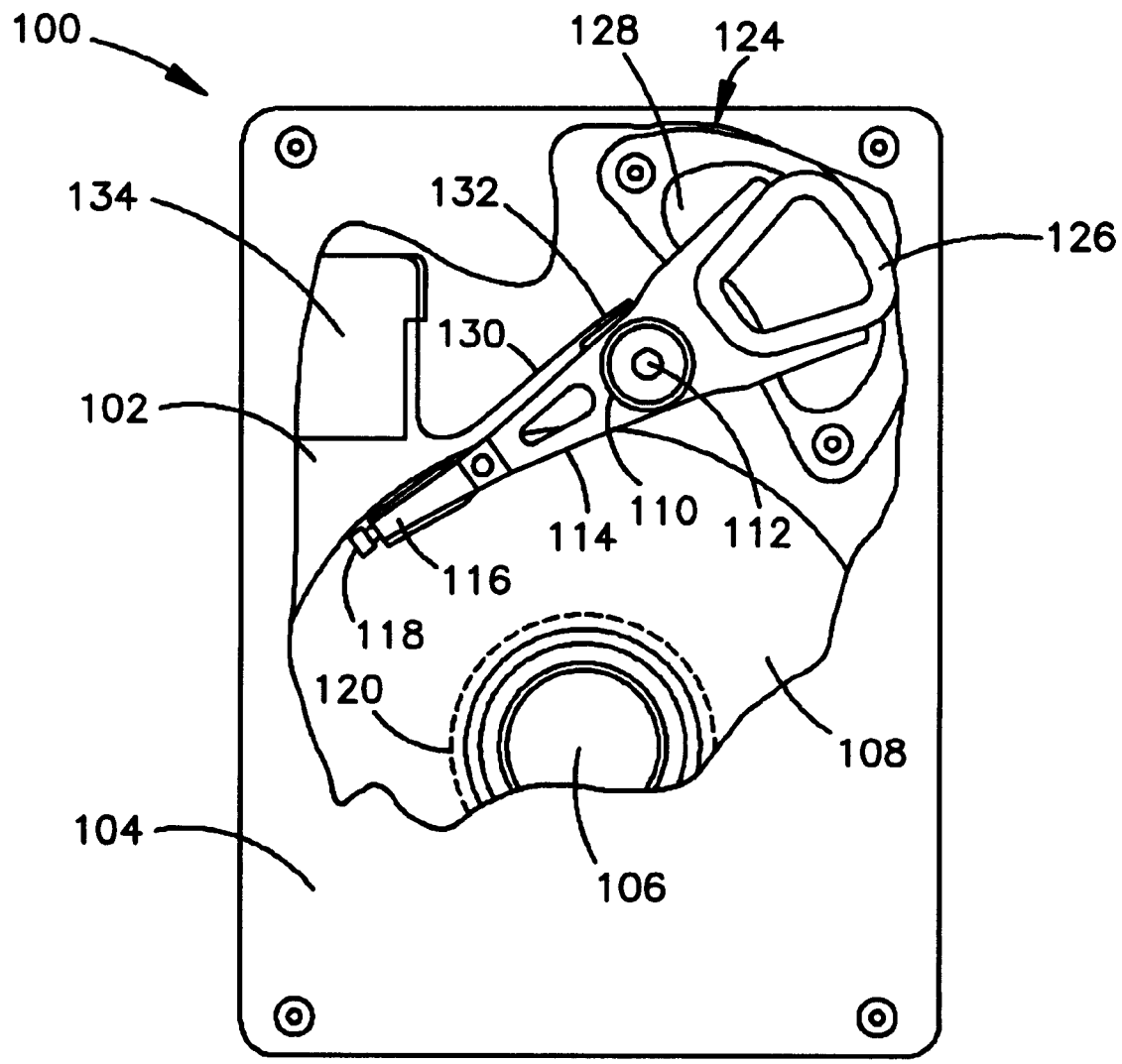
FIG. 1 is a plan view of a disc drive incorporating an exemplary embodiment of the present invention showing the primary internal components.

A disc drive 100 constructed in accordance with a preferred embodiment of the present invention is shown in FIG. 1. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106 which rotates one or more discs 108 at a constant high speed. Information is written to, and read from, tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114.

Mounted at the distal end of each of the flexures 116 is a head 118 which includes an air bearing slider enabling the head 118 to fly in close proximity above the corresponding surface of the associated disc 108. The flexures 116 act as the suspension, and the FOS discussed above in connection with the head 118 runs along the flexures 116.

During a seek operation, the track position of the heads 118 is controlled through the use of an actuator 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A PCCA 130 provides the requisite electrical connection paths for the actuator assembly 110 while allowing pivotal movement of the actuator assembly 110 during operation. The PCCA 130 has conductive leads electrically connected to a preamplifier circuit 132. Head leads embedded in the FOS are also connected to the PCCA 130 to establish communication with the preamplifier 132, and the FOS carrying the head leads is routed along the actuator arms 114 and the flexures 116 to the heads 118. The preamplifier circuit 132 controls the write currents applied to the heads 118 through the head leads during a write operation and amplifies read signals generated by the heads 118 and received through the head leads during a read operation. The PCCA 130 terminates at a bulkhead connector electrically connected to a flex bracket 134 for communication through the base deck 102 to a disc drive printed circuit board (not shown) mounted to the bottom side of the disc drive 100.

Figure 2:
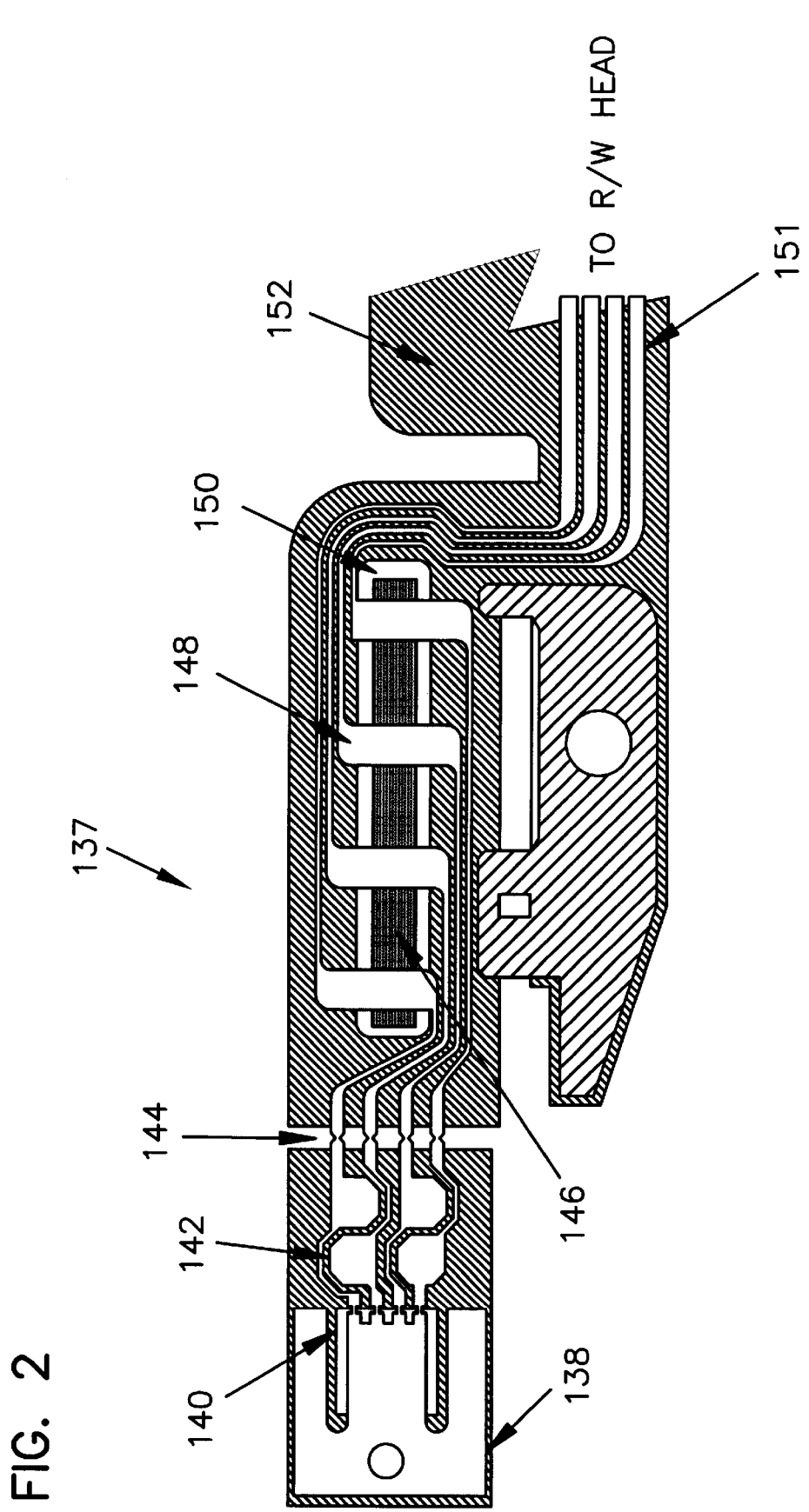
FIG. 2 is a plan view of an end portion of a FOS of the disc drive of FIG. 1 incorporating the exemplary embodiment of the present invention.

FIG. 2 illustrates an end portion of an exemplary FOS design 137 of disc drive 100 in more detail. Embodiments of the present invention apply to other FOS designs and electrical components as well, including flying lead FOS designs discussed in more detail below and components where electrical contacts may not be entirely exposed at the connection points. The FOS 137 is made of a polyimide base layer supporting embedded copper traces 151 that are overlaid by a top polyimide layer 152. Copper traces 151 are leads that initially extend from a shunt portion 138 present during manufacturing to the read/write head 118. The shunt portion 138 includes a copper tab electrically connected to all leads passing from the read/write head 118. Because all leads are electrically shorted, no electrostatic potential forms across the read/write head 118 while the shunt 138 remains attached. As will be discussed with reference to FIG. 3, the shunt portion 138 is removed prior to testing of the FOS 137 so that each lead may be individually checked for continuity and the read/write head 118 may be tested for proper operation.

The shunt portion 138 is connected to the remainder of the FOS 137 at a shunt tear away 140. The shunt tear away 140, which as shown is an area of less polyimide width, allows the shunt 138 to be easily removed through conventional removal operations. Test pads 142 provided beyond the shunt tear away 140 are exposed for connection to a test machine's electrical probes (not shown). A test pad tear away 144 is provided as a region allowing the test pads 142 to be easily removed, as will be discussed with reference to FIG. 3. As shown, the test pad tear away 144 includes a gap in the polyimide layer 152 with only the electrical leads passing through the gap.

In the example FOS 137 shown, a window 150 in the polyimide layer 152 lies beyond the test pad tear away 144. Exposed portions 148 of the copper traces 151 extend across the opening 150. The exemplary FOS 137 shown has four leads 151, with each of the four having an exposed portion 148 where two of the leads typically connect to a read element and two leads connect to the write element of the read/write head 118. The exposed portions 148 are electrically connected to the PCCA electrical connections (not shown) after the FOS 137 has been successfully tested. Subsequent to testing but prior to connection to the PCCA, a solder tape shunt 146 is applied across the exposed portions 148.

The solder tape shunt 146 reestablishes ESD protection for the read/write head 118 during the period between the FOS 137 testing and connection to the PCCA by shorting together all exposed leads 148 from the read/write head 118. During application of the exposed leads 148 of the FOS 137 to the electrical contacts of the PCCA, the solder tape shunt 146 is heated through conventional means to reflow the solder to the exposed portions 148 while they are in contact with the electrical connections of the PCCA. The solder tape shunt 146 fixes the electrical connection between the FOS 137 and the PCCA as it reflows, and the electrical short between the copper traces 151 is eliminated because the exposed portions 148 collect the reflowed solder such that it does not bridge from one exposed lead to another.

As discussed, the FOS 137 of FIG. 2 is one example of an ESD sensitive component utilizing an embodiment of the present invention. Other ESD sensitive components will equally benefit where the component must be left unshunted, such as for testing, and then be electrically connected to another component at some later time. Furthermore, other FOS designs will equally benefit. For example, flying lead FOS designs may utilize an embodiment of the present invention where the solder tape shunt is applied across the flying leads extending from a peripheral edge of the FOS, rather than extending across a window such as 150 within the FOS. Additionally, multiple solder tape shunts may be implemented rather than one continuous shunt, and only leads directed to a given component may be shorted in some embodiments rather than shorting all leads, such as shorting the leads of the read element in the read/write head 118 with one shunt and shorting the leads of the write element of the read/write head 118 with a different shunt. Also, the test pads may be integral to the FOS structure and therefore, not be removable.

Figure 3:
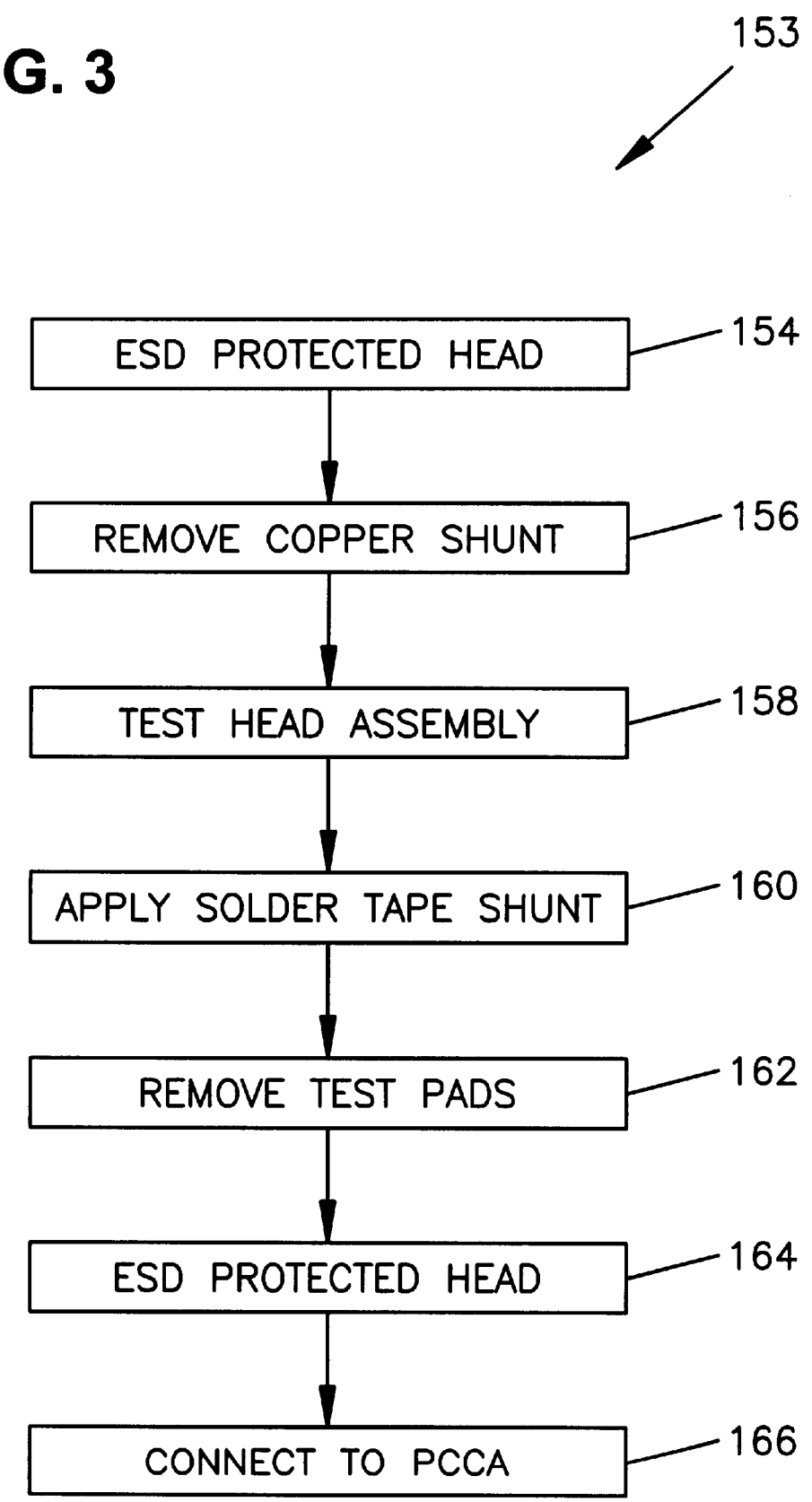
FIG. 3 is a flow chart of the shunting process in accordance with the exemplary embodiment of the present invention.

FIG. 3 shows the operational flow 153 of one embodiment of the present invention as applied to the FOS structure 137 of a disc drive 100. In its initial state, the shunt 138 is in place on the FOS 137 to protect the read/write head 118 at shunt operation 154. At remove operation 156, the copper shunt 138 is excised from the FOS 137 at the shunt tear away 140. This may be done simultaneously with the contacting of the test equipment probes with test pads 142. Once the test equipment probes are applied to the test pads 142 and the shunt 138 has been removed, the FOS 137 and read/write head 118 forming the head assembly may be tested at test operation 158.

After testing is completed, a solder tape shunt 146 is applied to the exposed trace contacts 148 at shunt operation 160 and the testing probes are removed. The solder tape shunt 146 may be applied by various methods, such as providing spooled solder tape having a predetermined length. Providing a controlled amount of solder tape that is pressed into place over the exposed leads 148 permits adequate bonding of the exposed leads 148 to the PCCA contacts but prevents a bridge of solder from extending across the gap between the exposed leads 148 once it is properly reflowed.

Once the solder tape 146 is in place, the test pads 142 may be removed by breaking the leads in the gap of the test pad tear away 144 at pad operation 162, and the FOS 137 is protected from ESD by the solder tape 146 during the tear away process. The FOS 137 maintains a protected state at protection operation 164 through the solder shunt tape 146 shorting the leads from the read/write head 118. Sometime after reestablishing the protected state and removing the test probes and test pads 142, the exposed contacts 148 of FOS 137 are fused to the PCCA contacts at connect operation 166. At this operation, the solder tape 146 is reflowed and is collected by the exposed leads 148 and their connection to the PCCA contacts. Because the solder tape 146 is entirely collected by the leads 148, it does not create shorts between any of the electrical connections 148 leading to the read/write head 118, and the FOS 137 and head 118 become operational. Because the solder 146 being used as the shunt is reflowed to bond the FOS leads 148 to the PCCA contacts, no solder pre-bumping of the PCCA contacts is required to establish the bond.

In conclusion, embodiments of the present invention may be viewed as a method for protecting an electrical component from electrostatic discharge prior to being electrically connected to an additional component. The method involves shunting (such as 160) one or more conductive leads (such as 148) extending from the electrical component to a second conductive lead (such as 148) extending from the electrical component with one or more solder conductors (such as 146). The one or more conductive leads (such as 148), the second conductive lead (such as 148), and the one or more solder conductors (such as 146) are contacted to electrical contacts of the additional component. The one or more solder conductors (such as 146) are heated (such as 166) until the one or more solder conductors (such as 146) electrically bond the one or more conductive leads (such as 148) and the second conductive lead (such as 148) to the electrical contacts of the additional component and until the one or more solder conductors (such as 146) no longer shunt the one or more conductive leads (such as 148) to the second conductive lead (such as 148).

The electrical component may be a flex on suspension circuit (such as 137) electrically connected to a read/write head (such as 118). The read/write head (such as 118) may have a read element and a write element with conductive leads (such as 148) extending from the read element being shunted with conductive leads (such as 148) extending from the write element. The read/write head (such as 118) may have conductive leads (such as 148) extending from the read element that are shunted and may also have conductive leads (such as 148) extending from the write element that are separately shunted.

The flex on suspension circuit (such as 137) has an opening (such as 150) exposing the conductive leads (such as 148), and the shunting (such as 160), the contacting (such as 166), and the heating (such as 166) occur within the opening (such as 137). The one or more solder conductors (such as 146) include a strip of solder tape (such as 146), and the shunting (such as 160) includes pressing the solder tape (such as 146) onto and across the one or more conductive leads (such as 148) and the second conductive lead (such as 148). The strip of solder tape (such as 146) may be of a predetermined length.

The method may further include prior to shunting (such as 160), shunting (such as 154) the one or more conductive leads (such as 148) with an electrical conductor (such as 138). The method may additionally include prior to shunting (such as 160), removing (such as 156) the electrical conductor (such as 138) shunting the one or more conductive leads (such as 148). The method may further include prior to shunting (such as 160), testing (such as 158) the operation of the electrical component (such as 137) by applying test signals across the one or more conductive leads (such as 148) and the second conductive lead (such as 148). The electrical component (such as 137) may have test pads (such as 142) electrically connected to the one or more conductive leads (such as 148) and the second conductive lead (such as 148), and the testing (such as 158) may include applying the test signals to the test pads. The method may further include prior to contacting (such as 166), removing (such as 162) the test pads (such as 142) from the electrical component (such as 137).

Embodiments of the invention may additionally be viewed as a system for preventing electrostatic discharge through an electrical component (such as 137) prior to electrically connecting the electrical component (such as 137) to an additional component. The system includes a solder conductor (such as 146) shunting one or more conductive leads (such as 148) extending from the electrical component to a second conductive lead (such as 148) extending from the electrical component (such as 137). The system includes electrical contacts on the additional component contacting the one or more conductive leads (such as 148), the second conductive lead (such as 148), and the one or more solder conductors (such as 146). The system also includes heat applied to the one or more solder conductors (such as 146) until the one or more solder conductors (such as 146) electrically bond the one or more conductive leads (such as 148) and the second conductive lead (such as 148) to the electrical contacts of the additional component and until the one or more solder conductors (such as 148) no longer shunt the one or more conductive leads (such as 148) to the second conductive lead (such as 148).

The electrical component may be a flex on suspension circuit (such as 137) electrically connected to a read/write head (such as 118). The read/write head (such as 118) may have a read element and a write element, and the solder conductor (such as 146) shunts the conductive leads (such as 148) extending from the read element with conductive leads (such as 148) extending from the write element. The flex on suspension circuit (such as 137) may have an opening (such as 150) exposing the conductive leads (such as 148) and wherein the solder conductor (such as 146), the electrical contacts, and the heat are provided within the opening (such as 150). The solder conductor (such as 146) may include a strip of solder tape (such as 146) pressed onto and across the one or more conductive leads (such as 148) and the second conductive lead (such as 148). The strip of solder tape (such as 146) may be of a predetermined length.

The system may further include an electrical conductor (such as 138) shunting the one or more conductive leads (such as 148) to the second conductive lead (such as 148) prior to application of the solder conductor (such as 146). The system may also include test signals applied across the one or more conductive leads (such as 148) and the second conductive lead (such as 148) after removal of the electrical conductor (such as 138) and prior to application of the solder conductor (such as 146) to the one or more conductive leads (such as 148) and the second conductive lead (such as 148). The electrical component (such as 137) may have test pads (such as 142) electrically connected to the one or more conductive leads (such as 148) and the second conductive lead (such as 148) and wherein the test signals are applied to the test pads (such as 142). The electrical component may be a flying lead flex on suspension circuit electrically connected to a read/write head (such as 118).

Another embodiment of the present invention relates to a system for preventing electrostatic discharge through an electrical component (such as 137) prior to electrically connecting the electrical component to an additional component. The system may include a plurality of conductive leads (such as 151) extending from the electrical component and a conductor means (such as 146). The conductor means preferably provides a shunt between one or more of the conductive leads and a second conductive lead prior to electrical connection to the additional component. The conductor means also preferably provides an electrical connection between one or more conductive leads and the additional component following removal of the shunt between the one or more conductive leads and the second conductive lead.

It will be clear that the present invention is well adapted to attain the ends and advantages mentioned as well as those inherent therein. While a presently preferred embodiment has been described for purposes of this disclosure, various changes and modifications may be made which are well within the scope of the present invention. For example, the shunting system may be applied to electrical components other than the FOS-read/write head combination that is subsequently connected to a PCCA. Additionally, the shunting system may apply to FOS designs other than those described herein, and the shunting material used to short the leads and then connect them to the additional component may be a solder conductor other than solder tape. While four connections have been shown as being shunted together, it should be understood that any number of connections of a device may be shunted together according to the present invention. Numerous other changes may be made which will readily suggest themselves to those skilled in the art and which are encompassed in the spirit of the invention disclosed and as defined in the appended claims.

What is claimed is:

1. A method for protecting an electrical component from electrostatic discharge prior to and during connection of the electrical component to an additional component, the method comprising steps of:
   a) shunting one or more conductive leads extending from the electrical component to a second conductive lead extending from the electrical component with one or more solder conductors;
   b) contacting the one or more conductive leads, the second conductive lead, and the one or more solder conductors to electrical contacts of the additional component; and
   c) heating the one or more solder conductors until the one or more solder conductors electrically bond the one or more conductive leads and the second conductive lead to the electrical contacts of the additional component and until the one or more solder conductors no longer shunt the one or more conductive leads to the second conductive lead.

2. The method of claim 1, wherein the electrical component is a flex on suspension circuit electrically connected to a read/write head.

3. The method of claim 2, wherein the read/write head has a read element and a write element, the shunting step a) comprising a step of:
   a)(i) shunting conductive leads extending from the read element together with conductive leads extending from the write element.

4. The method of claim 2, wherein the read/write head has a read element and a write element, the shunting step a) comprising a step of:
   a)(ii) shunting together conductive leads extending from the read element; and
   a)(iii) separately shunting together conductive leads extending from the write element.

5. The method of claim 2, wherein the flex on suspension circuit has an opening exposing the conductive leads, and the shunting step a), the contacting step b), and the heating step c) are performed within the opening.

6. The method of claim 1, wherein the one or more solder conductors include a strip of solder tape, and the shunting step a) comprises a step of:
   a)(iv) pressing the solder tape onto and across the one or more conductive leads and the second conductive lead.

7. The method of claim 6, wherein the strip of solder tape is of a predetermined length.

8. The method of claim 1, further comprising steps of:
   d) prior to shunting step a), shunting the one or more conductive leads to the second conductive lead with an electrical conductor;
   e) prior to shunting step a), removing the electrical conductor shunting the one or more conductive leads to the second conductive lead; and
   f) prior to shunting step a), testing the operation of the electrical component by applying test signals across the one or more conductive leads and the second conductive lead.

9. The method of claim 8, wherein the electrical component has test pads electrically connected to the one or more conductive leads and the second conductive lead, the testing step f) comprising a step of:
   f)(i) applying the test signals to the test pads.

10. The method of claim 9, further comprising a step of:
    g) prior to contacting step b), removing the test pads from the electrical component.

11. A system for preventing electrostatic discharge through an electrical component prior to and during connection of the electrical component to an additional component, comprising:
    a solder conductor shunting one or more conductive leads extending from the electrical component to a second conductive lead extending from the electrical component;
    electrical contacts on the additional component contacting the one or more conductive leads, the second conductive lead, and the one or more solder conductors; and
    heat applied to the one or more solder conductors until the one or more solder conductors electrically bond the one or more conductive leads and the second conductive lead to the electrical contacts of the additional component and until the one or more solder conductors no longer shunt the one or more conductive leads to the second conductive lead.

12. The system of claim 11, wherein the electrical component is a flex on suspension circuit electrically connected to a read/write head.

13. The system of claim 12, wherein the read/write head has a read element and a write element, and the solder conductor shunts together the conductive leads extending from the read element with conductive leads extending from the write element.

14. The system of claim 12, wherein the flex on suspension circuit has an opening exposing the conductive leads and wherein the solder conductor, the electrical contacts, and the heat are provided within the opening.

15. The system of claim 11, wherein the solder conductor includes a strip of solder tape pressed onto and across the one or more conductive leads and the second conductive lead.

16. The system of claim 15, wherein the strip of solder tape is of a predetermined length.

17. The system of claim 11, further comprising:

an electrical conductor shunting the one or more conductive leads to the second conductive lead prior to application of the solder conductor; and test signals applied across the one or more conductive leads and the second conductive lead after removal of the electrical conductor and prior to application of the solder conductor to the one or more conductive leads and the second conductive lead.

18. The system of claim 17, wherein the electrical component has test pads electrically connected to the one or more conductive leads and the second conductive lead and wherein the test signals are applied to the test pads.

19. The system of claim 11, wherein the electrical component is a flying lead flex on suspension circuit electrically connected to a read/write head.

20. A system for preventing electrostatic discharge through an electrical component prior to and during electrically connecting the electrical component to an additional component, comprising:

a plurality of conductive leads extending from the electrical component; and a conductor means for i) providing a shunt between one or more conductive leads of the plurality and a second conductive lead of the plurality prior to electrical connection of one or more conductive leads to the additional component, and ii) providing an electrical connection between one or more conductive leads and the additional component following removal of the shunt between the one or more conductive leads and the second conductive lead.

21. The system of claim 20, wherein the conductor means is operable to electrically bond the one or more conductive leads to the additional component upon application of a solder reflow process to the conductor means.

22. The system of claim 21, wherein the electrical component comprises a disc drive flex on suspension circuit.

23. The system of claim 20, wherein the conductor means comprises solder tape.

24. The system of claim 20, wherein the electrical component includes test pads electrically connected to the one or more conductive leads and the second conductive lead.

25. The system of claim 24, wherein the flex on suspension circuit includes means for exposing the conductive leads.

\* \* \* \* \*